United States Patent [19]

Kaufman et al.

[11] Patent Number: 4,788,765
[45] Date of Patent: Dec. 6, 1988

[54] METHOD OF MAKING CIRCUIT ASSEMBLY WITH HARDENED DIRECT BOND LEAD FRAME

[75] Inventors: Lance R. Kaufman, Mequon; John A. Dombeck, Glendale; Herbert O. Frederickson, Milwaukee, all of Wis.

[73] Assignee: Gentron Corporation, Milwaukee, Wis.

[21] Appl. No.: 120,626

[22] Filed: Nov. 13, 1987

[51] Int. Cl.$^4$ .............................................. H01R 43/00
[52] U.S. Cl. ..................... 29/827; 174/52.2; 174/52.4; 357/70
[58] Field of Search ............................ 357/70; 29/827; 174/52 PE, 52 FP

[56] References Cited

U.S. PATENT DOCUMENTS

| | | | |
|---|---|---|---|
| 3,404,319 | 10/1968 | Tsuji et al. | 357/70 X |
| 3,537,175 | 11/1970 | St. Clair et al. | 29/827 |
| 3,544,857 | 12/1970 | Byrne et al. | 174/52 PE X |
| 3,684,464 | 8/1972 | Happ et al. | 174/52 PE X |
| 3,744,120 | 7/1973 | Burgess et al. | |
| 3,766,634 | 10/1973 | Babcock et al. | |
| 3,768,986 | 10/1973 | Ramos et al. | 174/52 PE X |
| 3,854,892 | 12/1974 | Burgess et al. | |
| 3,911,553 | 10/1975 | Burgess et al. | |
| 3,958,075 | 5/1976 | Kaufman . | |
| 3,993,411 | 11/1976 | Babcock et al. | |
| 3,994,430 | 11/1976 | Cusano et al. | |
| 4,129,243 | 12/1978 | Cusano et al. | |
| 4,156,148 | 5/1979 | Kaufman . | |
| 4,196,411 | 4/1980 | Kaufman . | |
| 4,215,235 | 7/1980 | Kaufman . | |
| 4,218,724 | 8/1980 | Kaufman . | |
| 4,250,481 | 2/1981 | Kaufman . | |
| 4,266,140 | 5/1981 | Kaufman . | |
| 4,394,530 | 7/1983 | Kaufman . | |
| 4,449,165 | 5/1984 | Kaufman . | |
| 4,449,292 | 5/1984 | Kaufman . | |
| 4,488,202 | 12/1984 | Kaufman . | |
| 4,498,120 | 2/1985 | Kaufman . | |
| 4,546,410 | 10/1985 | Kaufman . | |
| 4,546,411 | 10/1985 | Kaufman . | |
| 4,554,613 | 11/1985 | Kaufman . | |
| 4,574,162 | 3/1986 | Kaufman . | |
| 4,577,387 | 3/1986 | Kaufman . | |
| 4,630,174 | 12/1986 | Kaufman . | |
| 4,700,273 | 10/1987 | Kaufman . | |

OTHER PUBLICATIONS

"Over 50 Years of Experience With the Direct Bond Copper Process", Tegmen Corp., 1201 East Fayette Street, Syracuse, N.Y.

*Primary Examiner*—Carl J. Arbes
*Attorney, Agent, or Firm*—Andrus, Sceales, Starke & Sawall

[57] ABSTRACT

In an electric circuit assembly (2) having conductive lead frames (8–10) directly bonded to an insulating substrate (6) by a eutectic, the lead frames are further subjected to a work hardening step (32, 34) to stiffen the lead frames and enable push-on fastener connection (12) to the lead frames without collapse thereof.

7 Claims, 1 Drawing Sheet

U.S. Patent    Dec. 6, 1988    4,788,765
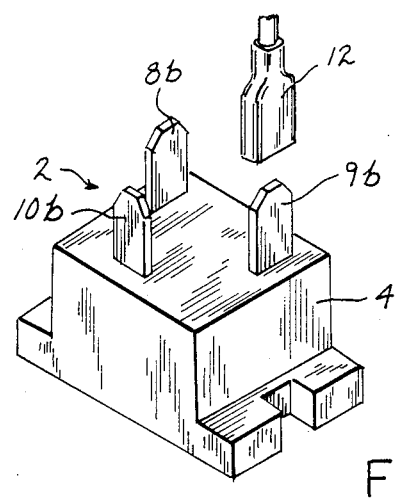
FIG. 1
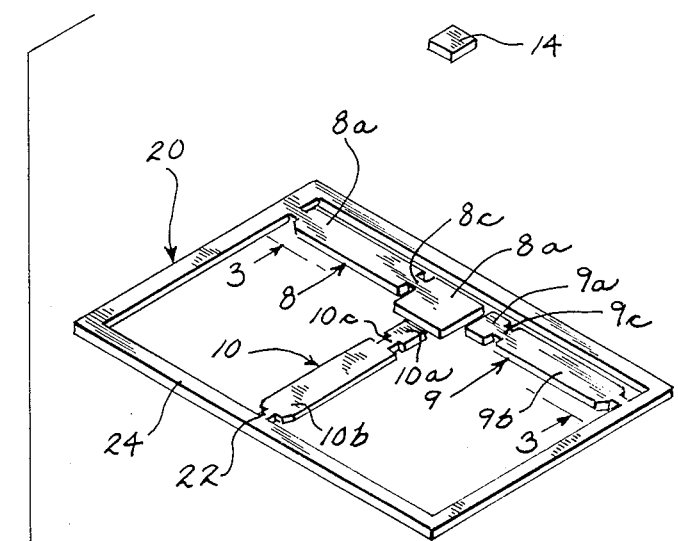
FIG. 2
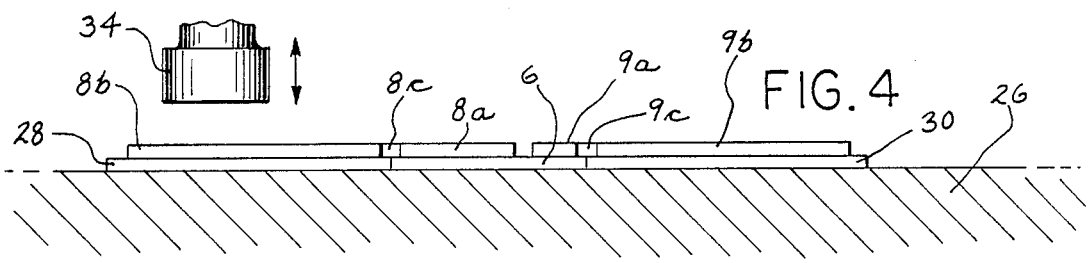
FIG. 3
FIG. 4
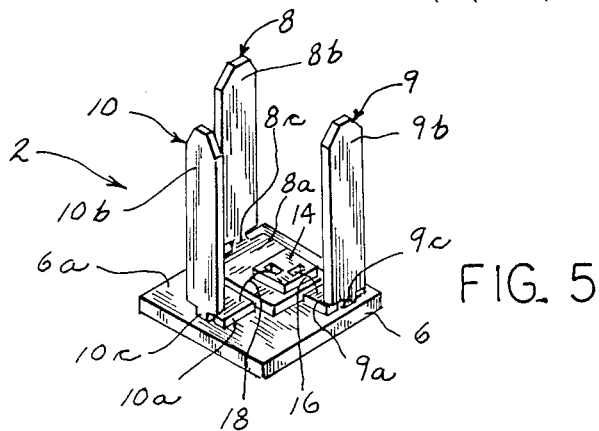
FIG. 5

4,788,765

METHOD OF MAKING CIRCUIT ASSEMBLY WITH HARDENED DIRECT BOND LEAD FRAME

BACKGROUND AND SUMMARY

The invention relates to electric circuit assemblies, and more particularly to an improved manufacturing method in combination.

Electric circuit assemblies are known, and typically include an electrically insulating thermally conductive nonmetallic refractory substrate, e.g. ceramic, having electrically conductive metallic lead frames, e.g. copper, mounted on top of the substrate, and semiconductor elements mounted on the lead frames. The structure is covered by an insulating housing which in turn is mounted to a heat sink such that the bottom surface of the ceramic substrate is in intimate contact with the heat sink. Examples of such circuit assemblies are shown in U.S. Patent Nos. 3,958,075, 4,156,148, 4,196,411, 4,215,235, 4,218,724, 4,250,481, 4,266,140, 4,394,530, 4,449,165, 4,449,292, 4,488,202, 4,498,120, 4,546,410, 4,546,411, 4,554,613, 4,574,162, 4,577,387, 4,630,174, and 4,700,273, incorporated herein by reference.

The copper lead frames are mounted to the ceramic substrate in various manners, for example by a solder reflow operation, or by a direct bond operation.

Direct bonding of the copper to the ceramic is known, and involves placing the lead frame in contact with the substrate, providing a reactive gas atmosphere which at an elevated temperature will react with the lead frame to form a eutectic, heating the lead frame and the substrate to a temperature below the melting point of the lead frame in the reactive atmosphere to form the eutectic with the lead frame which wets the lead frame and the substrate, and cooling the lead frame and the substrate with the lead frame bonded to the substrate. This direct bonding process is disclosed in U.S. Pat. Nos. 3,766,634, 3,993,411, 3,994,430, 3,911,553, 3,744,120, 3,854,892, and 4,129,243, incorporated herein by reference.

While the above noted direct bond process provides a good strong bond and eliminates the need for a solder reflow operation, it has been found that in an electric circuit assembly application as above, such process leaves the lead frames too soft. In fact, it has been found that lead frames so processed are subject to collapse upon push-on fastener connection thereto, and hence not suitable for electric circuit assembly application of the type noted above.

The present invention provides a simple yet effective method of making an electric circuit assembly incorporating the above noted direct bond process. The invention includes in combination a simple work hardening step for the lead frame to stiffen same and enable push-on fastener connection to the lead frame without collapse thereof.

BRIEF DESCRIPTION OF THE DRAWINGS

FIG. 1 is a perspective view of an electric circuit assembly and illustrates push-on fastener connection to a lead frame.

FIG. 2 is an exploded perspective view of the internal assembly of FIG. 1 in a preassembled condition.

FIG. 3 shows a further manufacturing step for the structure of FIG. 2.

FIG. 4 shows an alternative manufacturing step to that of FIG. 3.

FIG. 5 shows the assembled circuit of FIG. 1, with the cover housing removed.

DETAILED DESCRIPTION

FIG. 1 shows an electric circuit assembly 2 having an electrically insulating cover housing 4 to be mounted along its bottom against a heat sink (not shown). FIG. 5 shows the circuit assembly with housing 4 removed. The assembly includes an electrically insulating thermally conductive nonmetallic refractory ceramic substrate 6. A plurality of electrically conductive copper lead frames 8, 9 and 10 each has a first planar horizontal portion 8a, 9c and 10a, respectively, lying flat on the top planar horizontal surface 6a of the substrate, and second vertical portions 8b, 9b and 10b bent substantially 90° at respective junctions 8c, 9c and 10c to extend vertically upwardly from the substrate through apertures in the top of housing 4 for external circuit connection, as illustrated at push-on fastener connector 12. Semiconductor chip 14, FIG. 5, is mounted on lead frame portion 8a, and jumper wires 16 and 18 are connected from the chip to respective lead frame portions 9a and 10a. For example, if chip 14 is a MOSFET, its bottom surface is the drain pad and is in electrical contact with lead frame 8, its top source pad is connected by wire 16 to lead frame 9, and its top gate pad is connected by wire 18 to lead frame 10. Numerous other circuit and lead frame configurations are possible, for example as shown in the above incorporated circuit assembly patents.

During assembly, the lead frames are stamped in a given pattern from a copper sheet, as shown in FIG. 2 at pattern 20. The lead frames are held in the pattern by connection nibs such as 22 to an outer perimeter frame 24. The lead frame pattern is then placed on substrate 6 such that lead frame portions 8a, 9a and 10a are in contact with the top surface 6a of the substrate. Lead frame portions 8a, 9a and 10a are then directly bonded to substrate 6 according to the above incorporated direct bond process patents by providing a reactive gas atmosphere which at an elevated temperature will react with the lead frames to form a eutectic, heating the lead frames and the substrate to a temperature below the melting point of the lead frames in the reactive atmosphere to form the eutectic with the lead frames which wets the lead frames and the substrate, and cooling the lead frames and the substrate with the lead frames bonded to the substrate. The frame perimeter 24 is then removed by cutting through the nibs such as 22.

Substrate 6, with the lead frames bonded thereto, is then placed on a work table 26, FIG. 3. Thin auxiliary supports such as 28 and 30, having a thickness substantially the same as substrate 6, are then placed between the work table and the overhanging lead frame portions such as 8b and 9b which extend beyond substrate 6. The lead frames are then wok hardened by roller 32 applying pressure thereto. Lead frame portions 8b, 8c, 9b, 9c, 10b and 10c are rolled. Lead frame portions 8a, 9a and 10a may optionally be rolled. The overhanging lead frame portions are rolled against the respective supports such as 28 and 30.

In an alternative embodiment, FIG. 4, work hardening pressure is applied by ram or stamp 34 against the lead frames for stamping such lead frames. In this embodiment, it is preferred that lead frame portions 8a, 9a and 10a not be stamped, so as not to fracture the bond between such lead frame portions and substrate 6.

Chip 14 is then bonded to lead frame portion 8a, for example by a solder reflow operation. Jumper wires 16 and 18 are then bonded to the connection points noted above, for example by ultrasonic stitch bonds. Lead frame portions 8b, 9b and 10b are then bent upwardly such that junctions 8c, 9c and 10c form a right angle bend, providing the structure shown in FIG. 5.

It has been found that the work hardening stiffens the lead frames to enable push-on fastener connection without collapse of the lead frames. It is preferred that both the vertical lead frame portion such as 8b and the junction portion such as 8c be work hardened against deformation. It has been found that the junction such as 8c retains its work hardened capability after it is bent upwardly at a right angle. The work hardening can thus be performed prior to such bending, while lead frame portions 8b and 8a are still coplanar. This facilitates simplicity of the work hardening step.

It is recognized that various equivalents, alternatives and modifications are possible within the scope of the appended claims.

We claim:

1. A method of making an electric circuit assembly comprising:
   providing an electrically insulting thermally conductive nonmetallic refractory substrate;
   providing electrically conductive metallic lead frame means;
   directly bonding said lead frame means to said substrate by placing said lead frame means in contact with said substrate, heating said lead frame means and said substrate to a temperature below the melting point of said metallic lead frame means to form a eutectic with said lead frame means which wets said lead frame means and said substrate, and cooling said lead frame means and said substrate with said lead frame means bonded to said substrate;
   work hardening said lead frame means to stiffen said lead frame means and enable push-on fastener connection to said lead frame means without collapse thereof.

2. The invention according to claim 1 wherein said substrate has a planar horizontal top surface, and said lead frame means includes a first horizontal portion lying flat on said top surface of said substrate and a second portion integral with said first portion and extending therefrom to provide a terminal for external circuit connection, and wherein said work hardening comprises applying pressure to said second lead frame portion such that said second lead frame portion hardens and resists deformation upon push-on fastener connection to said second lead frame portion.

3. The invention according to claim 2 comprising providing flat coplanar said first and second lead frame portions, directly bonding said first lead frame portion to said substrate, work hardening said second lead frame portion and the junction between said first and second lead frame portions by applying pressure thereto, bending said second lead frame portion substantially 90° from said first lead frame portion to extend vertically upwardly from said substrate, wherein said junction between said first and second lead frame portions is a right angle bend hardened against deformation.

4. The invention according to claim 2 wherein said work hardening comprises rolling said second lead frame portion.

5. The invention according to claim 4 wherein said second lead frame portion extends laterally beyond said substrate, and comprising providing a support adjacent said substrate and beneath said second lead frame portion, and rolling said second lead frame portion against said support.

6. The invention according to claim 2 wherein said work hardening comprises stamping said second lead frame portion.

7. The invention according to claim 6 wherein said second lead frame portion extends laterally beyond said substrate, and comprising providing a support adjacent said substrate and beneath said second lead frame portion, and stamping said second lead frame portion against said support, without stamping said first lead frame portion.

* * * * *